(12) United States Patent
Tao et al.

(10) Patent No.: US 10,490,639 B2
(45) Date of Patent: Nov. 26, 2019

(54) LOW COLLECTOR CONTACT RESISTANCE HETEROJUNCTION BIPOLAR TRANSISTORS

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/937,068

(22) Filed: Mar. 27, 2018

(65) Prior Publication Data

US 2019/0305094 A1 Oct. 3, 2019

(51) Int. Cl.
| | |
|---|---|
| H01L 29/417 | (2006.01) |
| H01L 29/737 | (2006.01) |
| H01L 29/205 | (2006.01) |
| H01L 29/08 | (2006.01) |
| H01L 29/10 | (2006.01) |
| H01L 21/285 | (2006.01) |
| H01L 29/45 | (2006.01) |
| H01L 29/66 | (2006.01) |
| H01L 21/306 | (2006.01) |
| H01L 21/308 | (2006.01) |

(52) U.S. Cl.
CPC .. *H01L 29/41708* (2013.01); *H01L 21/28575* (2013.01); *H01L 21/308* (2013.01); *H01L 21/30612* (2013.01); *H01L 29/0817* (2013.01); *H01L 29/0826* (2013.01); *H01L 29/1004* (2013.01); *H01L 29/205* (2013.01); *H01L 29/452* (2013.01); *H01L 29/66242* (2013.01); *H01L 29/737* (2013.01)

(58) Field of Classification Search
CPC .......... H01L 29/41708; H01L 29/0826; H01L 21/30612; H01L 29/66242; H01L 29/452; H01L 21/308; H01L 29/1004; H01L 29/0817; H01L 29/205; H01L 29/737; H01L 21/28575
See application file for complete search history.

(56) References Cited

U.S. PATENT DOCUMENTS

2011/0316050 A1* 12/2011 Bito .................... H01L 27/0605
257/197

OTHER PUBLICATIONS

Hashimoto Y., et al., "Effect of Low-Temperature Annealing on the Crystallinity of III—V-Based Diluted Magnetic Semiconductors," Journal of Crystal Growth, 2002, vol. 237-239, pp. 1334-1338.
(Continued)

*Primary Examiner* — David Vu
(74) *Attorney, Agent, or Firm* — Qualcomm Incorporated

(57) ABSTRACT

In certain aspects, a heterojunction bipolar transistor (HBT) comprises a collector mesa, a base mesa on the collector mesa, and an emitter mesa on the base mesa. The base mesa has a tapered sidewall tapering from a wide bottom to a narrow top. The HBT further comprises a collector contact on a portion of the collector mesa and extending to a portion of the tapered sidewall of the base mesa.

13 Claims, 17 Drawing Sheets

(56) References Cited

OTHER PUBLICATIONS

Missous M., et al., "Low Temperature (LT) and Stoichiometric Low Temperature (SLT) MBE GaAs and Related Compounds: Improved Structural, Electrical and Optical Properties," Journal of Crystal Growth, 1997, vol. 175-176, pp. 197-202.

Shimawaki H., et al., "High-fmax AlGaAs/InGaAs and AlGaAs/GaAs HBT's with p+/p Regrown Base Contacts," IEEE Transactions on Electron Devices, Oct. 1995, vol. 42, No. 10, pp. 1735-1744.

* cited by examiner

LOW COLLECTOR CONTACT RESISTANCE HETEROJUNCTION BIPOLAR TRANSISTORS

BACKGROUND

Field

Aspects of the present disclosure relate to the semiconductor devices, and more particularly, to apparatuses and manufacturing methods for improving collector contact resistance of a heterojunction bipolar transistor.

Background

The heterojunction bipolar transistor (HBT) is a type of bipolar junction transistor (BJT) that uses different semiconductor materials for the emitter and base regions, creating a heterojunction. The HBT improves on the BJT in that the HBT can handle signals of very high frequencies, up to several hundred GHz. The HBT is commonly used in modern ultrafast circuits, mostly radio-frequency (RF) systems, and in applications requiring a high power efficiency, such as RF power amplifiers in cellular phones.

A critical aspect of low-power, high-speed HBT operation is a low emitter and collector contact resistance. Conventionally, a low bandgap alloy, such as an InGaAs ohmic contact layer, is grown on top of the emitter before the deposition of the emitter contact metal. However, similar processes may not be applicable for the collector contact. Due to lattice mismatch, a conventionally grown InGaAs ohmic contact layer for collector contact causes dislocation for subsequent base and emitter epi layers. In addition, it is difficult to isolate from neighboring HBTs in a collector InGaAs ohmic contact layer.

Accordingly, it would be beneficial to provide apparatuses and manufacturing methods for improving collector contact resistance of a heterojunction bipolar transistor.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a heterojunction bipolar transistor (HBT) comprises a collector mesa, a base mesa on the collector mesa, and an emitter mesa on the base mesa. The base mesa has a tapered sidewall tapering from a wide bottom to a narrow top. The HBT further comprises a collector contact on a portion of the collector mesa and extending to a portion of the tapered sidewall of the base mesa.

In another aspect, a method comprises providing an HBT having a collector mesa, a base mesa on the collector mesa, and an emitter mesa on the base mesa. The base mesa has a tapered sidewall tapering from a wide bottom to a narrow top. The method further comprises forming a photoresist layer on the HBT and patterning the photoresist layer with one or more photoresist openings. The one or more photoresist openings expose a first region of the collector mesa and a first region of the tapered sidewall of the base mesa.

The method also comprises depositing a collector contact metal over the first region of the collector mesa and the first region of the tapered sidewall of the base mesa.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

Heterojunction bipolar transistors (HBTs) are used for digital and analog microwave applications with frequencies up to several hundred GHz. The HBTs are often used in power amplifiers in mobile telephones, satellite broadcast systems, automobile collision avoidance systems, global positioning systems, and other high-frequency applications. The HBTs offer much higher speed of operation and higher drive current than the more prevalent metal-oxide-semiconductor field-effect transistors (MOSFETs) or even conventional homojunction bipolar transistors (BJT), e.g., PNP or NPN silicon transistors. Power-added efficiency (PAE) is a metric for rating the efficiency of a power amplifier. The PAE is used to calculate how much input power a device converts into useful output power. The PAE of an HBT is directly associated with the device load line. The collector and emitter contact resistances partially determine the load line range and play an important role in an HBT's PAE. Accordingly, it would be beneficial to provide novel collector structures and methods to reduce the collector resistance.

Figure 1:
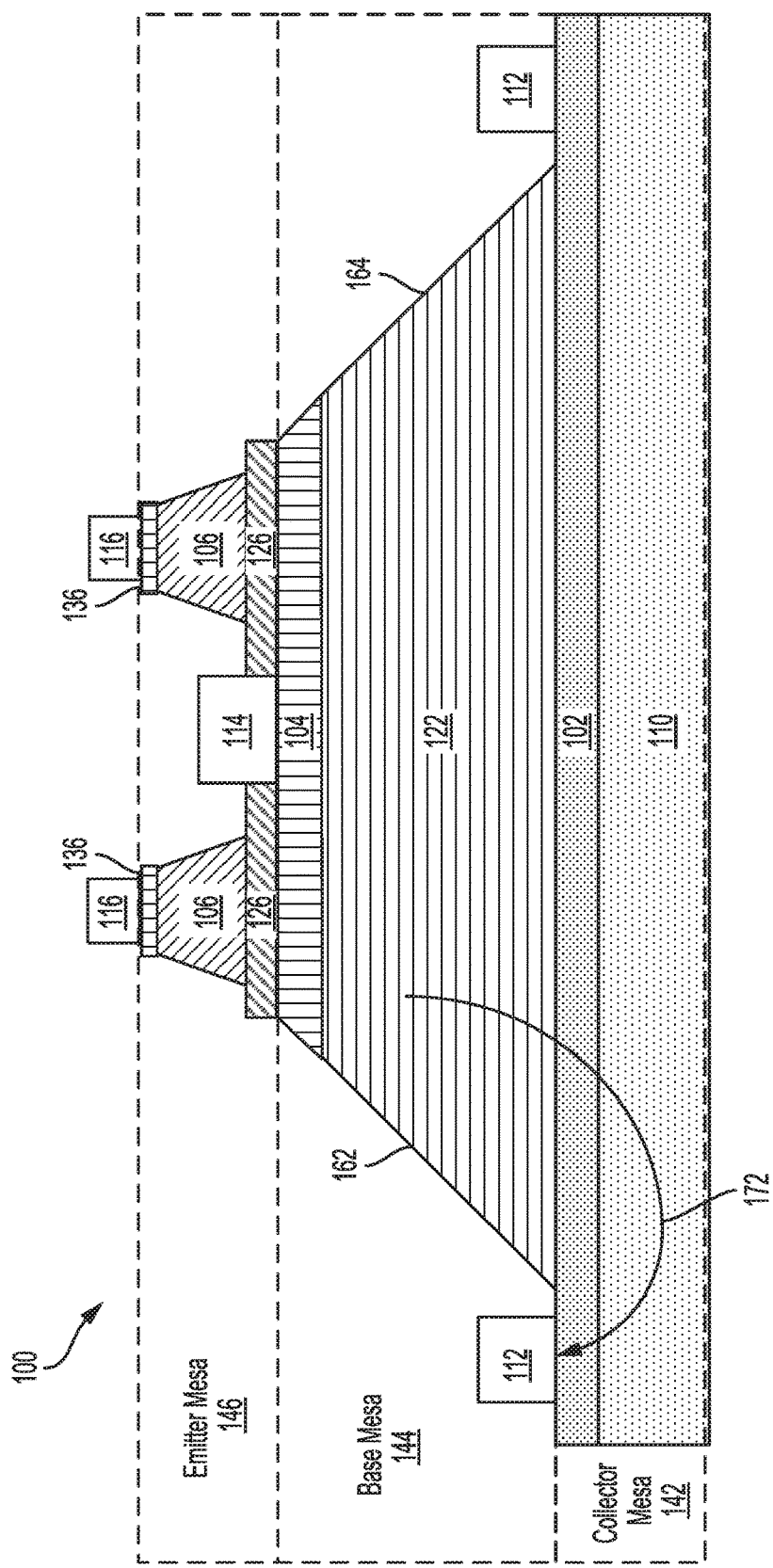
FIG. 1 illustrates an example HBT cross section according to certain aspects of the present disclosure.

FIG. 1 illustrates an example HBT cross section according to certain aspects of the present disclosure. The HBT 100 comprises three main stacks: a collector mesa 142, a base mesa 144 on the collector mesa 142, and an emitter mesa 146 on the base mesa 144. The collector mesa 142 includes a substrate 110 (e.g., GaAs or Al doped GaAs substrate) and a sub-collector 102 (e.g., N+ GaAs). The base mesa 144 includes a collector 122 (e.g., N or N− GaAs) and a base 104 (P+ GaAs or InGaAs or GaAsSb). The emitter mesa 146 includes an emitter 126 (N or N− GaInP), an emitter cap 106 (N+ or N GaAs), and an emitter ohmic contact layer 136 (e.g., graded N+ InGaAs). In addition, the HBT 100 also comprises one or more collector contacts 112 on the sub-collector 102, one or more base contacts 114 on the base 104, and one or more emitter contacts 116 on the emitter ohmic contact layer 136.

As illustrated in FIG. 1, because the etching goes both vertically and horizontally, the base mesa 144 has a tapered sidewall 162. The base mesa 144 tapers from a wide bottom to a narrow top. Because of the wide bottom of the base mesa 144, the collector contacts 112 is placed horizontally further away from the base 104, increasing the length of the current path 172 to the collector contacts 112, and decreasing the area available for the collector contacts 112. As a result, the collector resistance increases and the PAE of the HBT 100 decreases.

Figure 2:
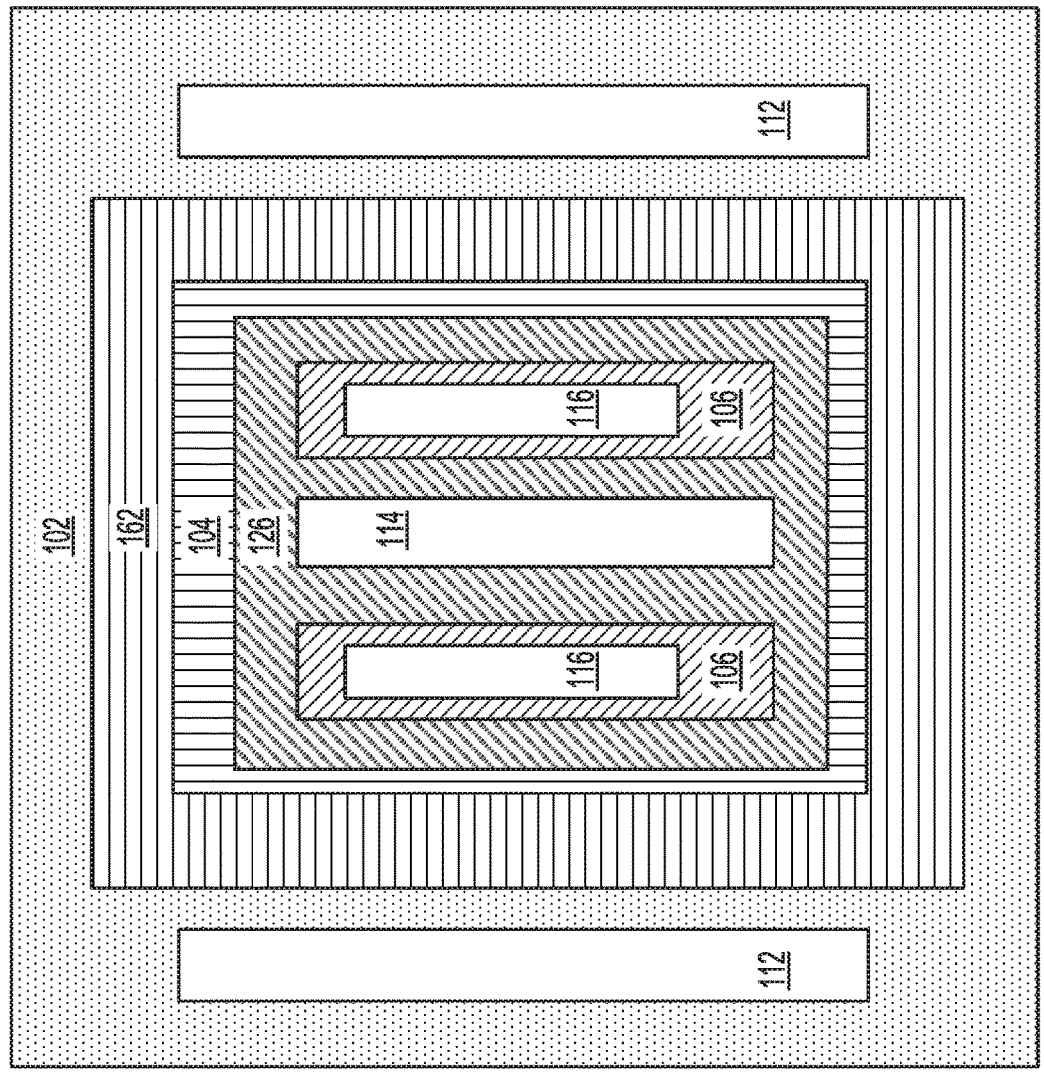
FIG. 2 illustrates an example top-down view of an HBT according to certain aspects of the present disclosure.

FIG. 2 illustrates an example top-down view of the HBT 100 according to certain aspects of the present disclosure. Because the emitter 126 is on the base mesa 144, only a portion of the base mesa 144 is shown, which is the tapered sidewall 162 of the base mesa.

Figure 3:
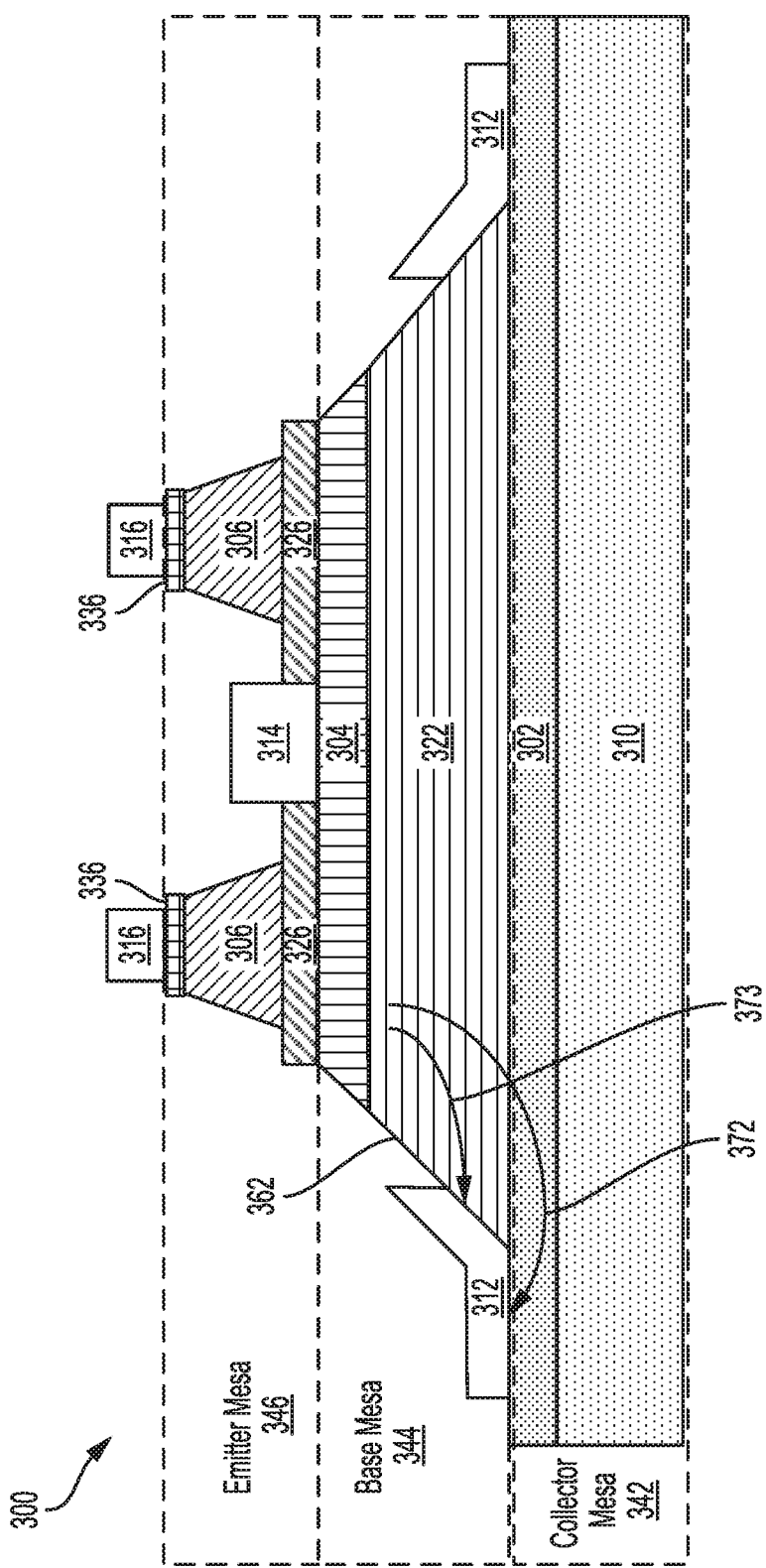
FIG. 3 illustrates an exemplary HBT cross section according to certain aspects of the present disclosure.

FIG. 3 illustrates an exemplary HBT cross section according to certain aspects of the present disclosure. Like the HBT 100, the HBT 300 comprises three main stacks: a collector mesa 342, a base mesa 344 on the collector mesa 342, and an emitter mesa 346 on the base mesa 344. The collector mesa 342 includes a substrate 310 and a sub-collector 302. The base mesa 344 includes a collector 322 and a base 304. The emitter mesa 346 includes an emitter 326, an emitter cap 306, and an emitter ohmic contact layer 336. The base mesa 344 has a tapered sidewall 362. The base mesa 344 tapers from a wide bottom to a narrow top. The HBT 300 also comprises one or more base contacts 314 on the base 304 and one or more emitter contacts 316 on the emitter ohmic contact layer 336.

However, unlike the HBT 100, the HBT 300 comprises one or more collector contacts 312 on both the sub-collector 302 and the tapered sidewall 362. The collector contacts 312 are placed on the collector 322 and further extends to the lower portion of the tapered sidewall 362. By placing the collector contacts 312 on both a portion of the sub-collector 302 and a portion of the tapered sidewall 362, the collector contacts 312 is closer to the base 304, minimizing the area of the HBT 300. Furthermore, the collector contact area increases, reducing the contact resistance. Moreover, by placing the collector contacts on the tapered sidewall 362, a shorter current path 373, in addition to the current path 372, is added, further decreasing the collector resistance. As a result, the PAE of the HBT 300 is improved over the HBT 100.

Figure 4:
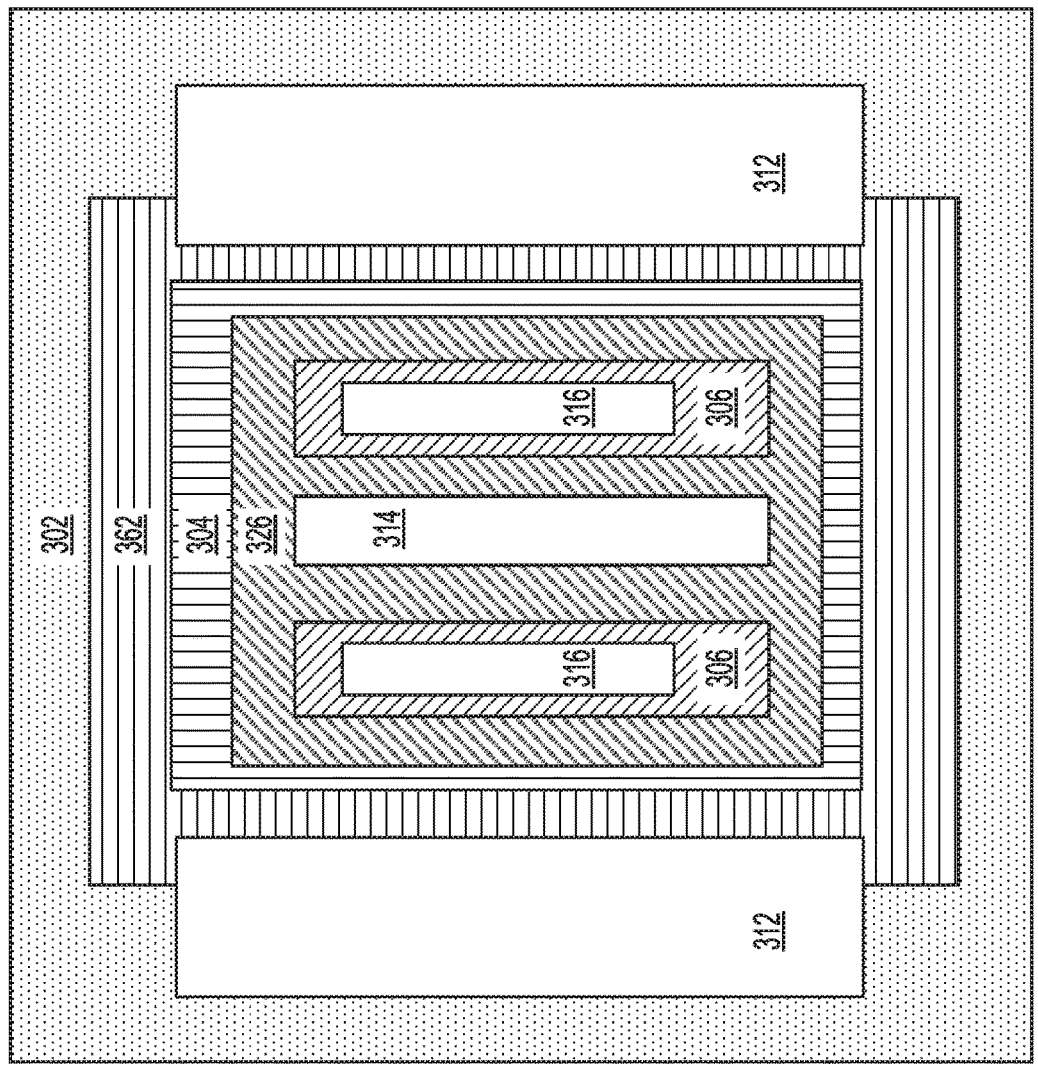
FIG. 4 illustrates an exemplary top-down view of an HBT according to certain aspects of the present disclosure.

FIG. 4 illustrates an exemplary top-down view of the HBT 300 according to certain aspects of the present disclosure. Because the emitter 326 is on the base mesa 344, only a portion of the base mesa 344 is shown, which is the tapered sidewall 362. A portion of the tapered sidewall 362 is further blocked by the collector contact 312 as the collector contact 312 is extended and partially placed on a portion of the tapered sidewall 362, specifically, the lower portion of the tapered sidewall 362.

Figure 5:
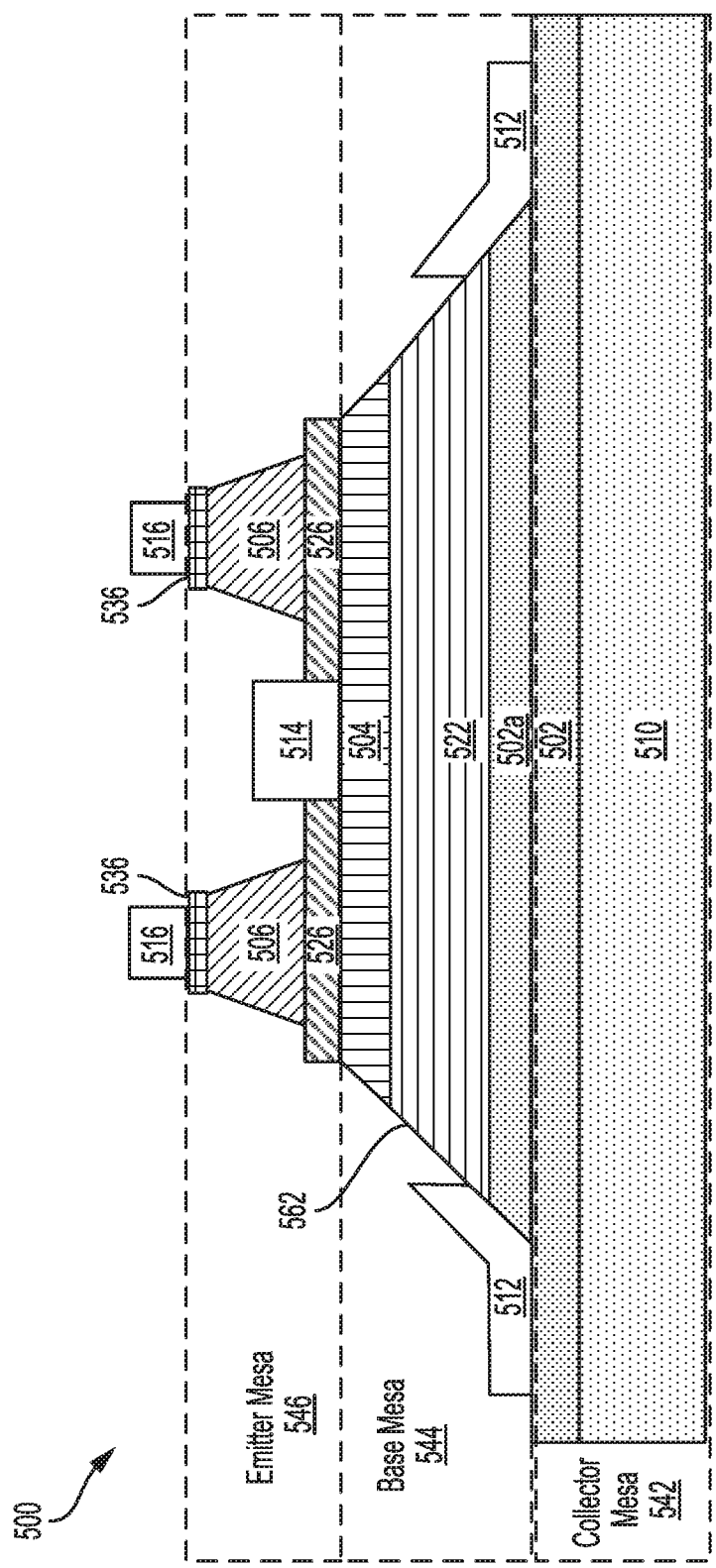
FIG. 5 illustrates another exemplary HBT cross section according to certain aspects of the present disclosure.

FIG. 5 illustrates another exemplary HBT cross section according to certain aspects of the present disclosure. Like the HBT 300, the HBT 500 comprises three main stacks: a collector mesa 542, a base mesa 544 on the collector mesa 542, and an emitter mesa 546 on the base mesa 544. The collector mesa 542 includes a substrate 510 and a sub-collector 502. The base mesa 544 includes a collector 522 and a base 504. The emitter mesa 546 includes an emitter 526, an emitter cap 506, and an emitter ohmic contact layer 536. The base mesa 544 has a tapered sidewall 562. The base mesa 544 tapers from a wide bottom to a narrow top. The HBT 500 also comprises one or more base contacts 514 on the base 504, one or more emitter contacts 516 on the emitter ohmic contact layer 536, and one or more collector contacts 512 on the sub-collector 502 and the base mesa tapered sidewall 562.

In addition, the base mesa 544 includes a layer of extra sub-collector 502a that has a tapered sidewall and is part of the tapered sidewall 562. The extra sub-collector 502a comprises same material as the sub-collector 502. By adding the extra sub-collector 502a in the base mesa 544, the height of the base mesa 544 increases, providing more sidewall area for the collector contacts 512, increasing the size of the collector contacts 512, and reducing the collector contact resistance. The extra sub-collector 502a may have same material as the sub-collector 502. The collector contacts 512 covers both the lower and upper portion of the sidewall of the extra sub-collector 502a.

Figure 6:
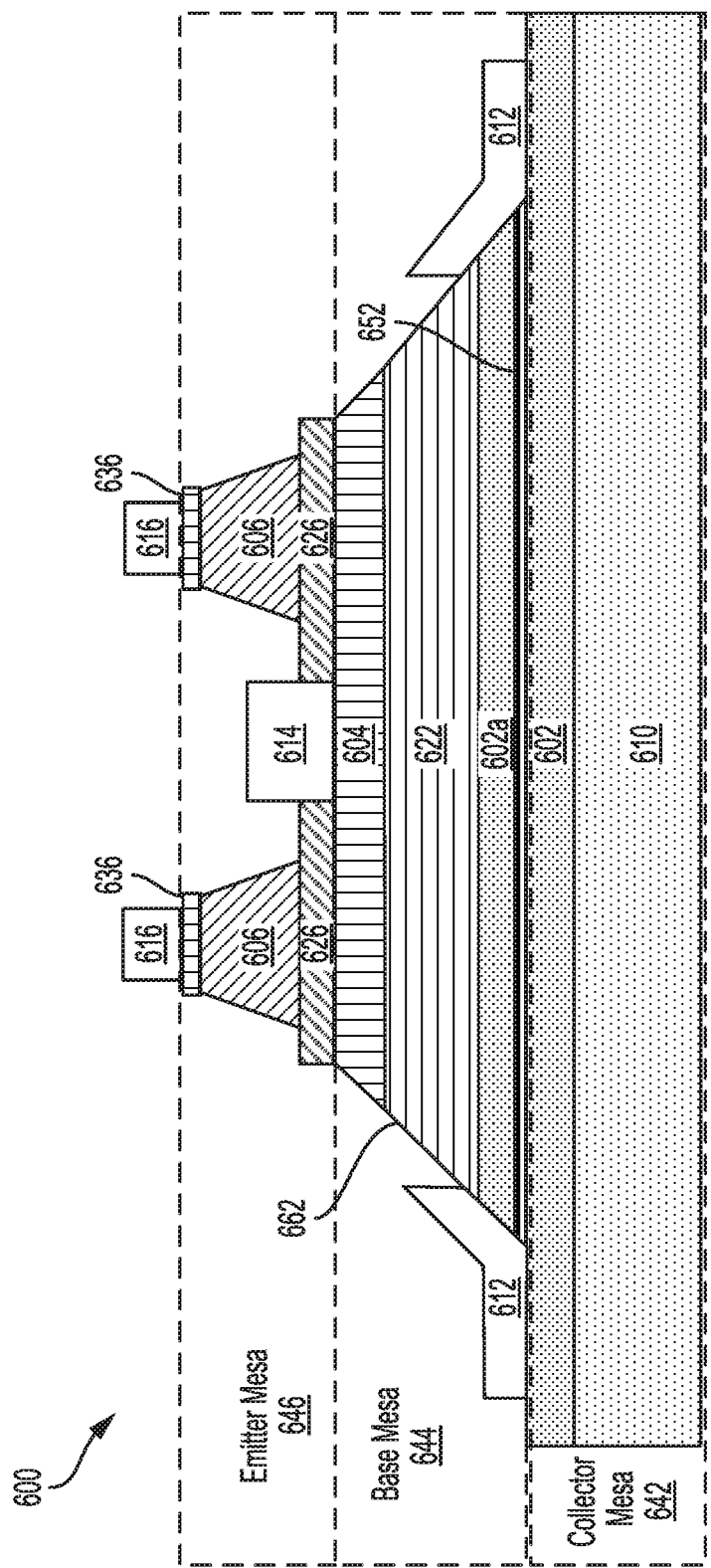
FIG. 6 illustrates still another exemplary HBT cross section according to certain aspects of the present disclosure.

FIG. 6 illustrates yet another exemplary HBT cross section according to certain aspects of the present disclosure. Like the HBT 500, the HBT 600 comprises three main stacks: a collector mesa 642, a base mesa 644 on the collector mesa 642, and an emitter mesa 646 on the base mesa 644. The collector mesa 642 includes a substrate 610 and a sub-collector 602. The base mesa 644 includes an extra sub-collector 602a, a collector 622 and a base 604. The extra sub-collector 602a comprises same material as the sub-collector 602. The base mesa 644 has a tapered sidewall 662 (the sidewall of the extra sub-collector 602a, the collector 622, and the base 604). The base mesa 644 tapers from a wide bottom to a narrow top. The emitter mesa 646 includes an emitter 626, an emitter cap 606, and an emitter ohmic contact layer 636. The HBT 600 also comprises one or more base contacts 614 on the base 604, one or more emitter contacts 616 on the emitter ohmic contact layer 636, and one or more collector contacts 612 on the sub-collector 602 and the base mesa tapered sidewall 662.

In addition, between the extra sub-collector 602a and the sub-collector 602 is a layer of etch stop layer 652 (e.g., InGaP layer). The thin etch stop layer 652 facilitates the control of the etch depth of the base mesa 644 (the etch stops at the etch stop layer 652) and serves as a boundary of the base mesa 644 and the collector mesa 642.

Figure 7:
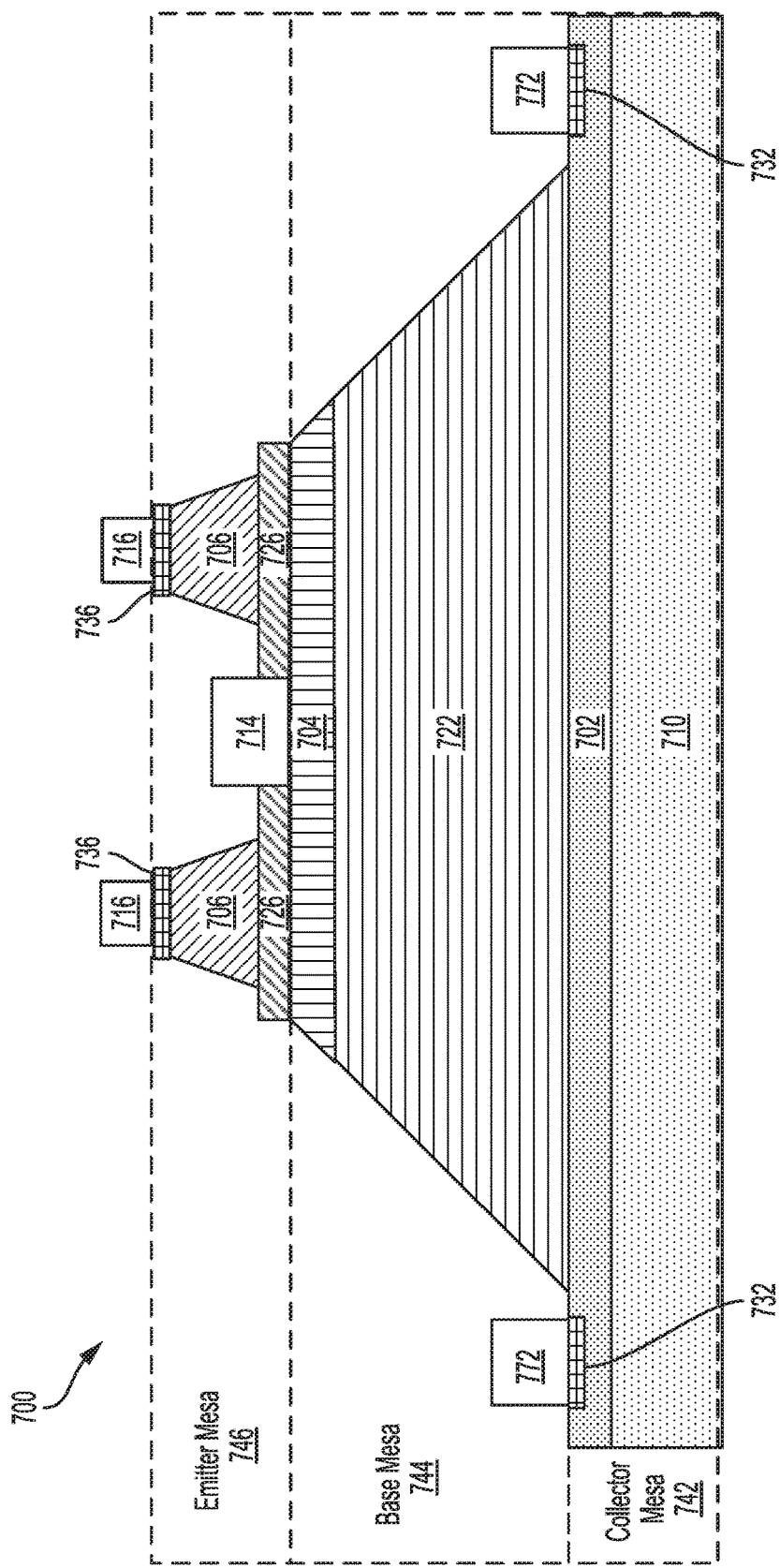
FIG. 7 illustrates still another exemplary HBT cross section according to certain aspects of the present disclosure.

FIG. 7 illustrates still another exemplary HBT cross section according to certain aspects of the present disclosure.

Like the HBT 100, the HBT 700 comprises three mesa stacks: a collector mesa 742, a base mesa 744 on the collector mesa 742, and an emitter mesa 746 on the base mesa 744. The collector mesa 742 includes a substrate 710 and a sub-collector 702. The base mesa 744 includes a collector 722 and a base 704. The emitter mesa 746 includes an emitter 726, an emitter cap 706, and an emitter ohmic contact layer 736. The HBT 700 also comprises one or more base contacts 714 on the base 704, one or more emitter contacts 716 on the emitter ohmic contact layer 736, and one or more collector contacts 712. Each of the collector contacts 712 is on a collector ohmic contact layer 732. The collector ohmic contact layer 732 comprises low bandgap alloys, such as InAs or InGaAs, whose bandgap is lower than the bandgap of the sub-collector 702. The collector ohmic contact layer 732 is grown locally in the sub-collector 702 at the place for the collector contacts 712. By growing locally at expense of extra process steps, the collector ohmic contact layer 732 would not incur potential lattice mismatch or isolation issues for forming epi layers for the base mesa and emitter mesa.

Figure 8:
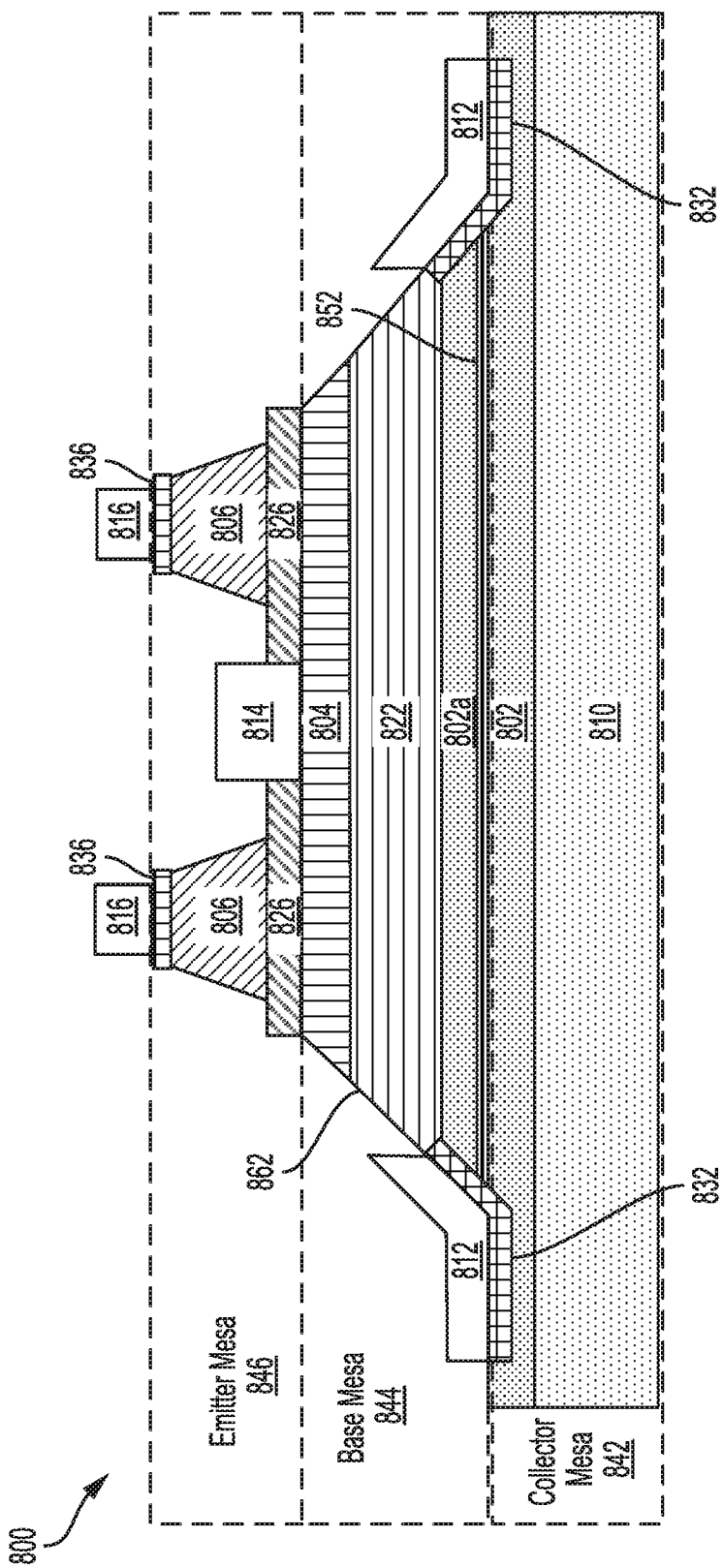
FIG. 8 illustrates still another exemplary HBT cross section according to certain aspects of the present disclosure.

FIG. 8 illustrates still another exemplary HBT cross section according to certain aspects of the present disclosure. The HBT 800 combines the improvement of the HBT 600 and HBT 700. The HBT 800 comprises three main stacks: a collector mesa 842, a base mesa 844 on the collector mesa 842, and an emitter mesa 846 on the base mesa 844. The collector mesa 842 includes a substrate 810 and a sub-collector 802. The base mesa 844 includes a collector 822 and a base 804. The base mesa 844 may further includes an optional extra sub-collector 802a and an optional etch stop layer 852. The emitter mesa 846 includes an emitter 826, an emitter cap 806, and an emitter ohmic contact layer 836. The base mesa 844 has a tapered sidewall 862 (including the sidewall of the extra sub-collector 802a if the extra sub-collector 802a is included). The base mesa 844 tapers from a wide bottom to a narrow top. The HBT 800 also comprises one or more base contacts 814 on the base 804, one or more emitter contacts 816 on the emitter ohmic contact layer 836, and one or more collector contacts 812 on the sub-collector 802 and extending to the base mesa tapered sidewall 862. The sub-collector 802 may comprise a collector ohmic contact layer 832. The collector ohmic contact layer 832 is in or on a portion the sub-collector 802 and in or on a portion of the tapered sidewall 862.

Figure 9A:
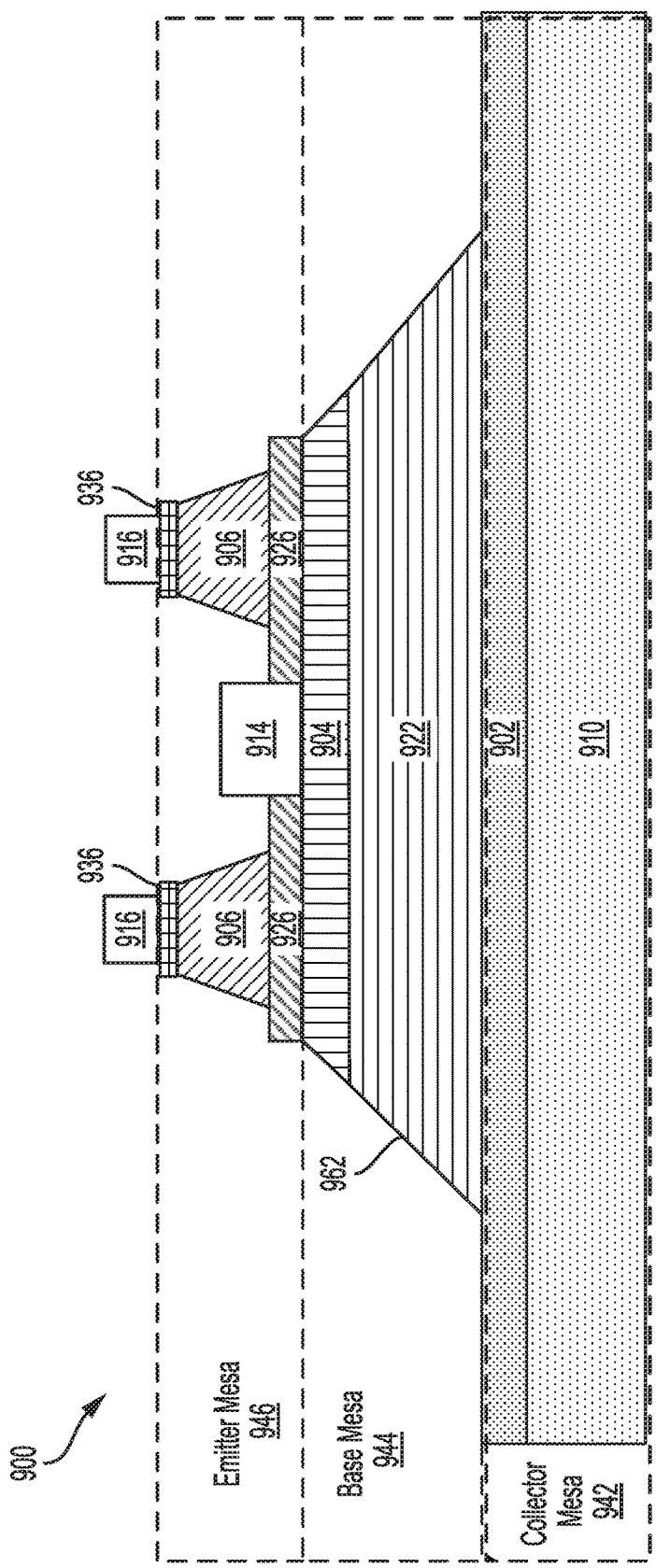
FIGS. 9a-9d illustrate an exemplary process flow for forming HBT collector contacts according to certain aspects of the present disclosure.

FIGS. 9a-9d illustrate an exemplary process flow for forming HBT collector contacts according to certain aspects of the present disclosure. FIG. 9a shows a starting HBT. The starting HBT 900 comprises three main stacks: a collector mesa 942, a base mesa 944 on the collector mesa 942, and an emitter mesa 946 on the base mesa 944. The collector mesa 942 includes a substrate 910 and a sub-collector 902. The base mesa 944 includes a collector 922 and a base 904. The base mesa 944 may further includes an optional extra sub-collector (not shown) on the sub-collector 902 and an optional etch stop layer (not shown) between the extra sub-collector and the sub-collector 902. The emitter mesa 946 includes an emitter 926, an emitter cap 906, and an emitter ohmic contact layer 936. The base mesa 944 has a tapered sidewall 962 (including the sidewall of the extra sub-collector if the extra sub-collector is included). The base mesa 944 tapers from a wide bottom to a narrow top. The HBT 900 also comprises one or more base contacts 914 on the base 904 and one or more emitter contacts 916 on the emitter ohmic contact layer 936. The collector contacts for the HBT 900 have yet to be formed.

Figure 9B:
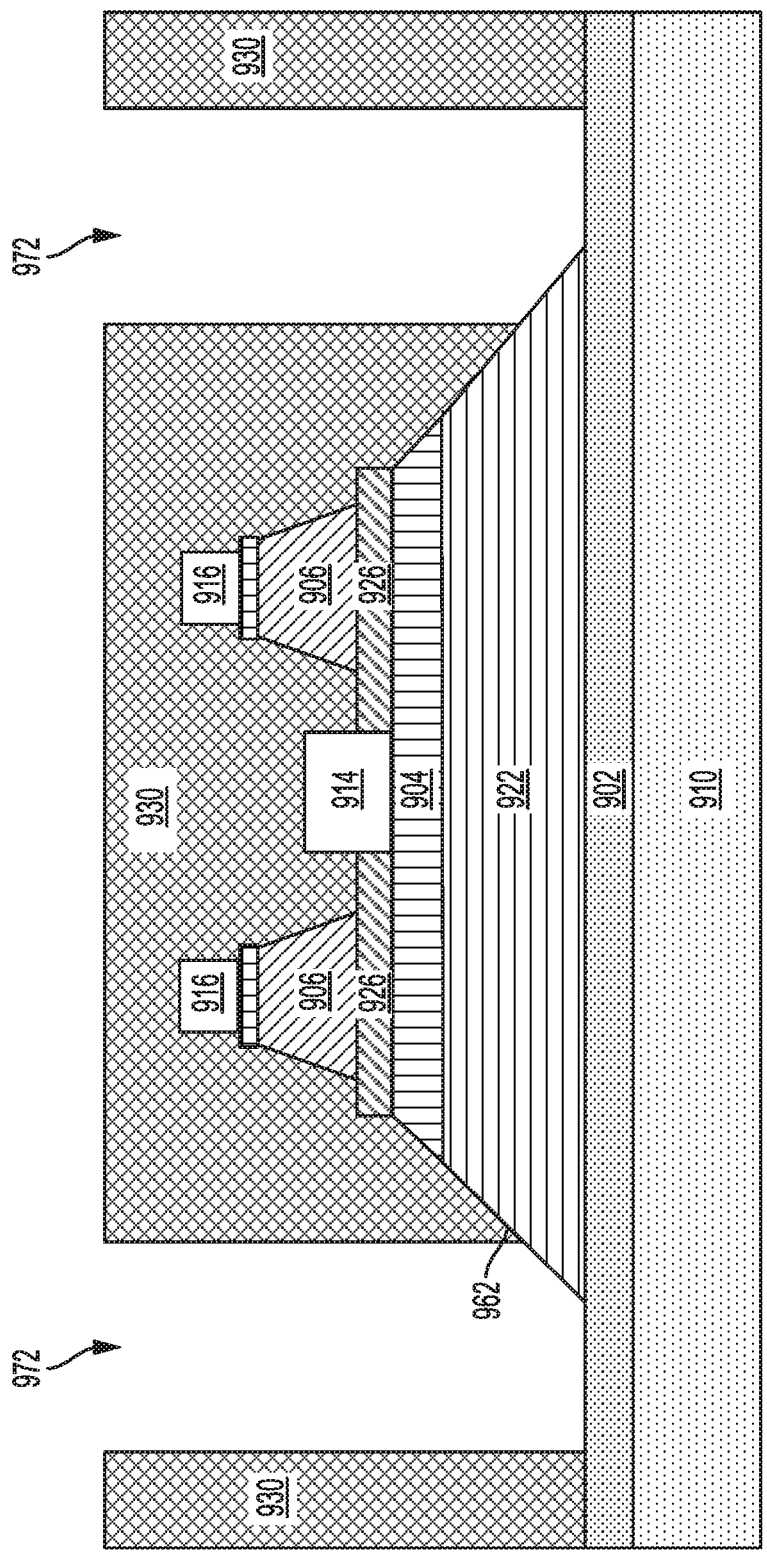

In FIG. 9b, a photoresist 930 is placed (e.g., by spin coating) on the HBT 900. The photoresist 930 is further patterned to have one or more openings 972. The openings 972 expose a region of the sub-collector 902 and a region of the tapered sidewall 962 for placing one or more collector contacts.

Figure 9C:
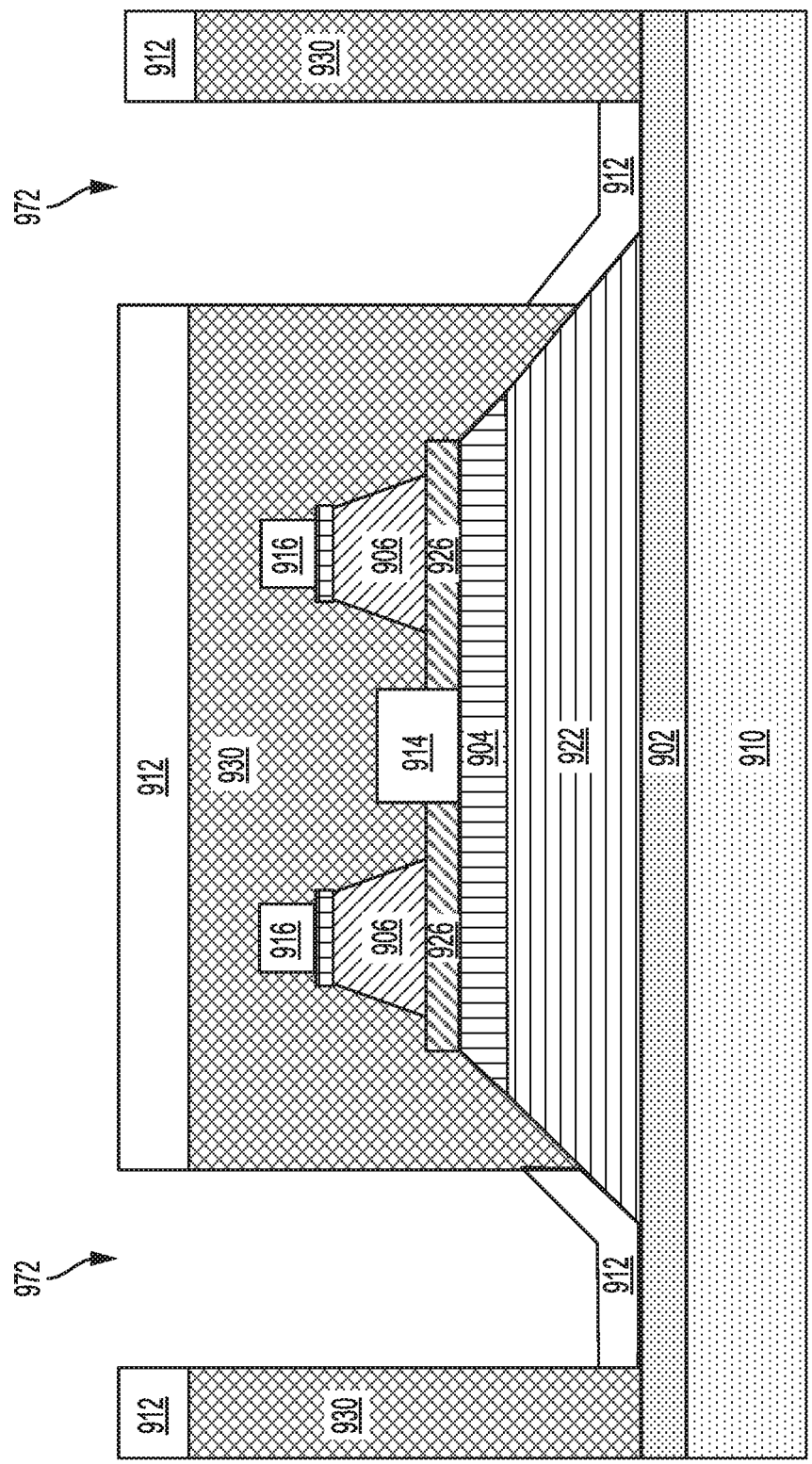

In FIG. 9c, metal 912 is deposited (e.g., by evaporation or sputtering) over the photoresist 930 and through the openings 972, over the region of the exposed sub-collector 902 and the region of the exposed tapered sidewall 962.

Figure 9D:
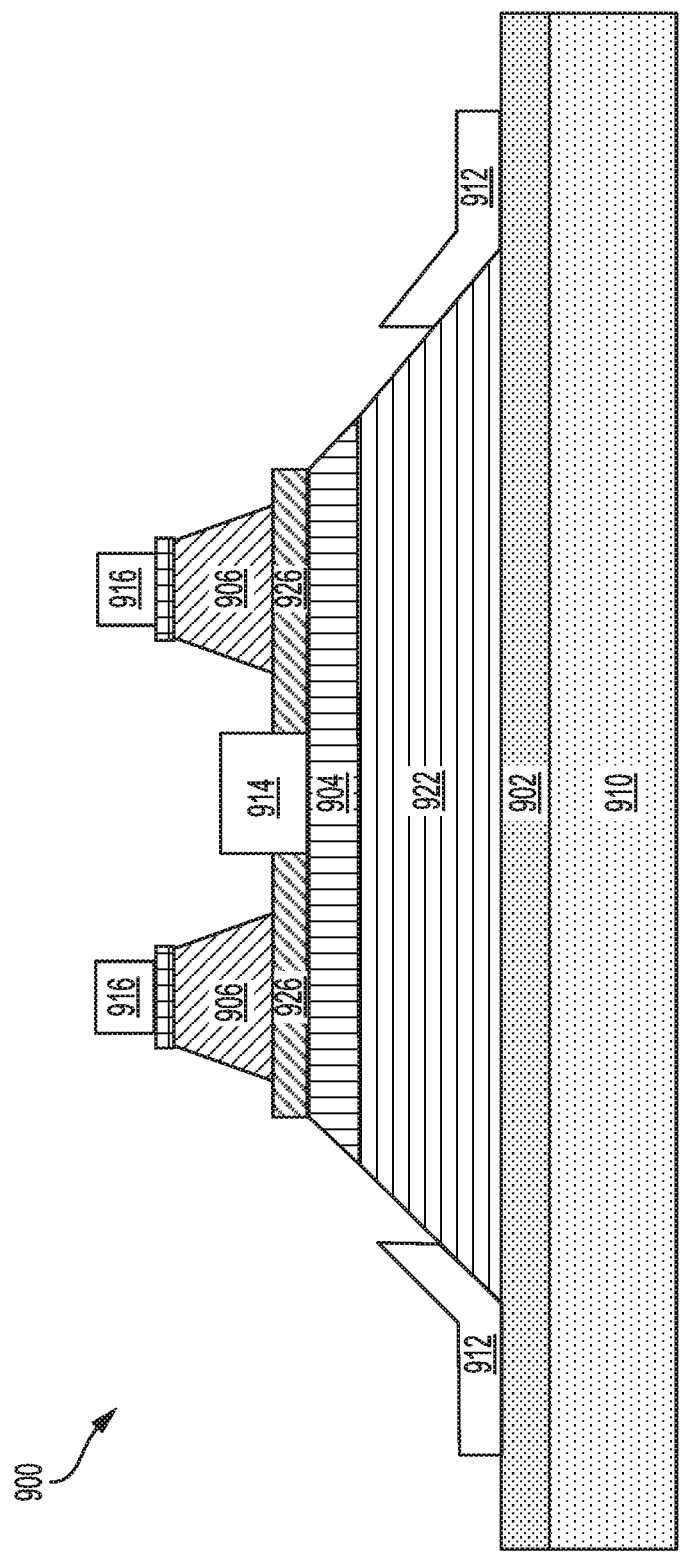

In FIG. 9d, the photoresist 930 is removed (e.g., by wet or dry stripping). The metal 912 on the photoresist 930 is lifted off with the photoresist 930. Only the metal 912 on the region of the sub-collector 902 and the region of the tapered sidewall 962 remains and forms the collector contacts of the HBT 900.

In the previous description, although the collector mesa (e.g., the collector mesas 142, 342, 542, 642, 742, 842, and 942) is used to refer to the bottom stack of an HBT, the collector mesa is not necessary formed by etching and may not necessary have one or more sidewalls. The collector mesa may refer to a stack that is isolated from neighboring HBT through implantation (e.g., oxidation).

Figure 10A:
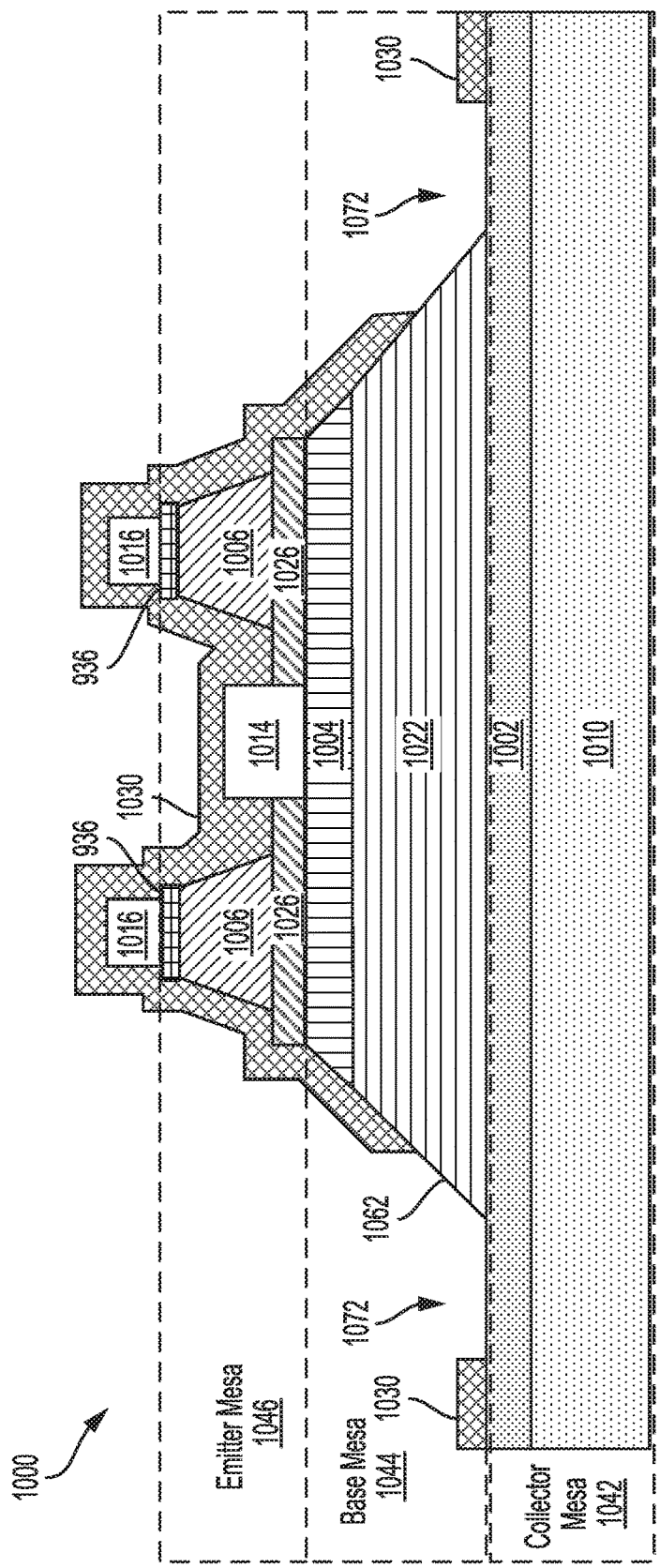
FIGS. 10a-10c illustrate an exemplary process flow for forming a collector ohmic contact layer according to certain aspects of the present disclosure.
Figure 10B:
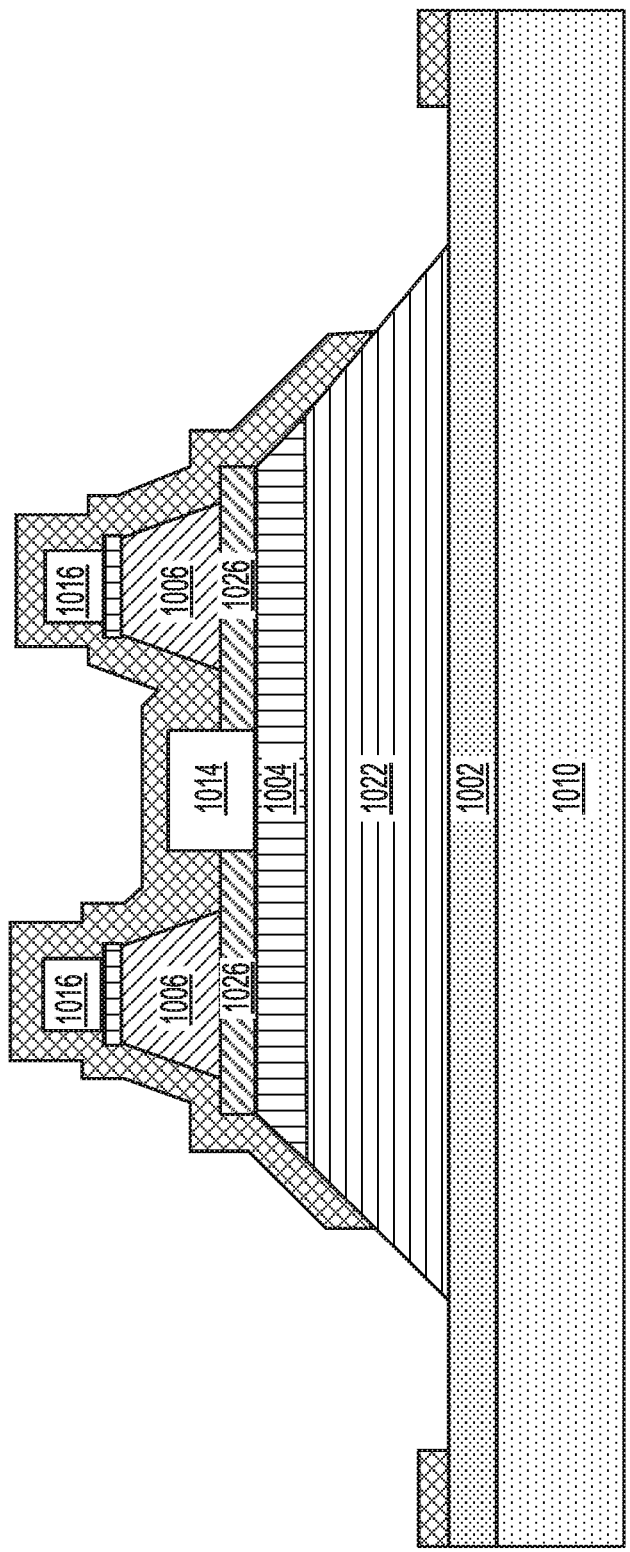
Figure 10C:
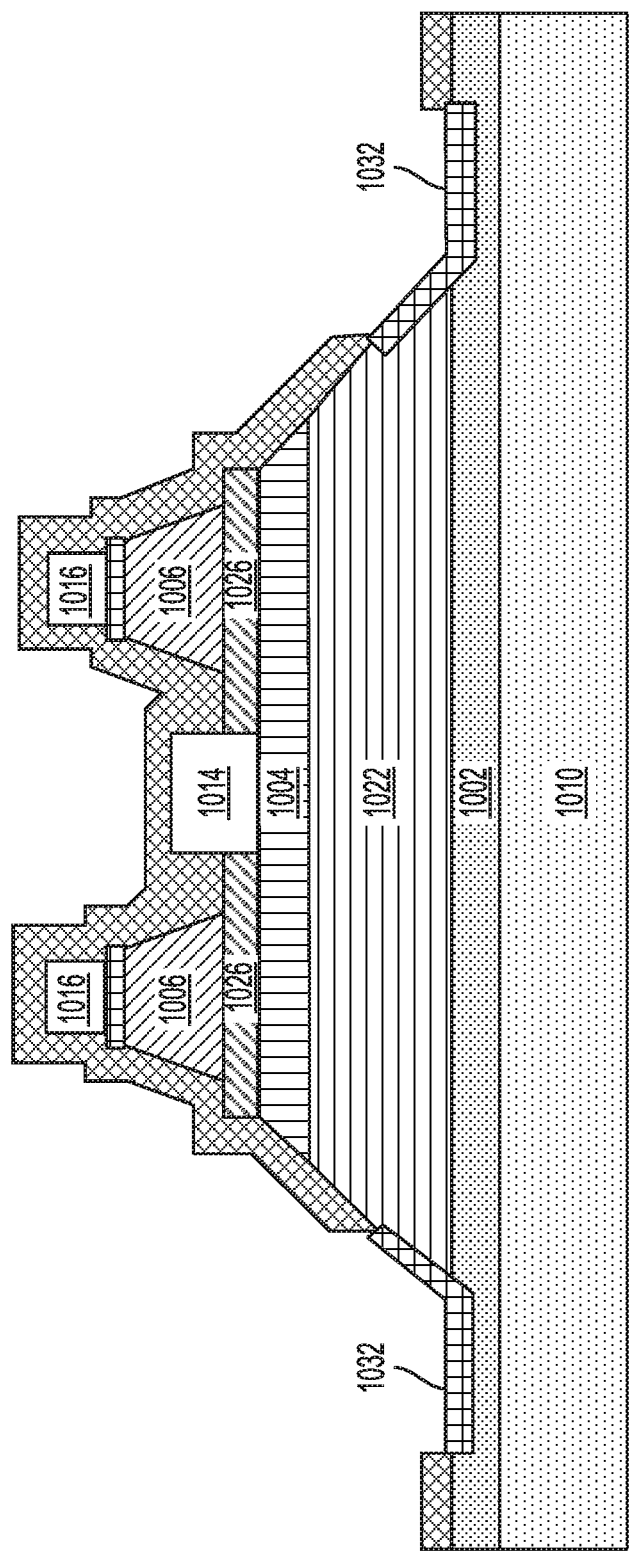

FIGS. 10a-10c illustrate an exemplary process flow for forming a collector ohmic contact layer according to certain aspects of the present disclosure. FIG. 10a shows a starting HBT. The HBT 1000 comprises three main stacks: a collector mesa 1042, a base mesa 1044 on the collector mesa 1042, and an emitter mesa 1046 on the base mesa 1044. The collector mesa 1042 includes a substrate 1010 and a sub-collector 1002. The collector mesa may be formed by etching or by implantation to isolate from the neighboring devices. The base mesa 1044 includes a collector 1022 and a base 1004. The base mesa 1044 may further includes an optional extra sub-collector (not shown) on the sub-collector 1002 and an optional etch stop layer (not shown) between the extra sub-collector (not shown) and the sub-collector 1002. The emitter mesa 1046 includes an emitter 1026, an emitter cap 1006, and an emitter ohmic contact layer 1036. The base mesa 1044 has a tapered sidewall 1062 (including the sidewall of the extra sub-collector if the extra sub-collector is included). The base mesa 1044 tapers from a wide bottom to a narrow top. The HBT 1000 also comprises one or more base contacts 1014 on the base 1004 and one or more emitter contacts 1016 on the emitter ohmic contact layer 1036. A silicon nitride layer or silicon oxide layer or the like is deposited over the HBT 1000 as a mask 1030. The mask is patterned through photolithography process to open one or more windows 1072 for collector contact formation. The windows 1072 are on the sub-collector 1002 and may be on the tapered sidewall 1062.

In FIG. 10b, etching is performed in the windows 1072. A thin layer of the sub-collector 1002 in the windows 1072 is etched away. If the windows 1072 are on the tapered sidewall 1062 as well, a thin layer of the tapered sidewall 1062 in the windows 1072 is etch away, too.

In FIG. 10c, a thin layer of low bandgap metal alloy 1032 is regrown in the etched region. The low bandgap metal alloy 1032 may be InAs or InGaAs, which has lower bandgap than the sub-collector, providing a low resistivity barrier to collector contacts (not formed yet). The metal alloy 1032 may be selectively regrown with MBE or MOCVD at low temperature (e.g., less than 300° C.).

After the regrowth of the low bandgap metal alloy 1032, the collector contacts may be formed through the process flow illustrated in FIG. 9a-9d.

Figure 11:
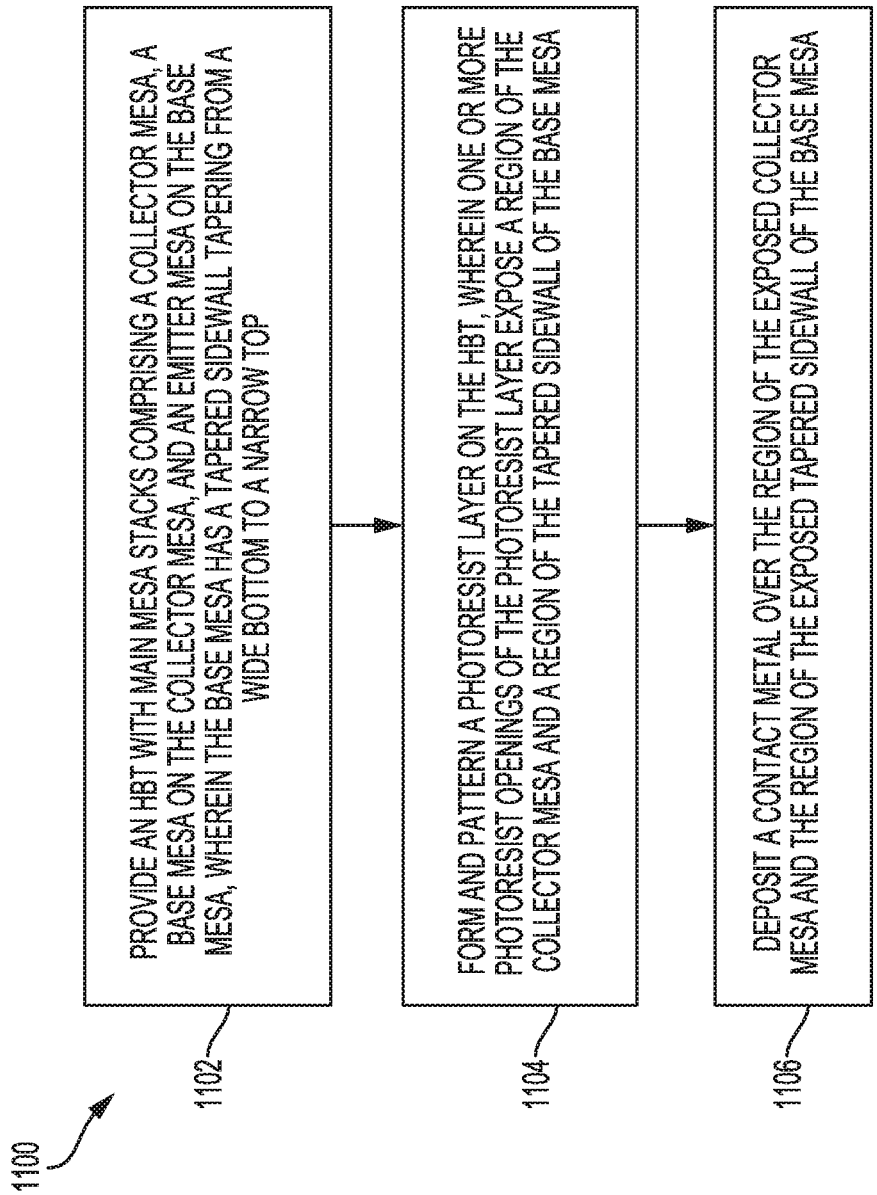
FIG. 11 illustrates an exemplary method for forming HBT collector contacts according to certain aspects of the present disclosure.

FIG. 11 illustrates an exemplary method 1100 for making an HBT collector contact according to certain aspects of the present disclosure. At 1102, an HBT is provided (e.g., the HBT 900). The HBT comprises main HBT mesa stacks with a collector mesa (e.g., the collector mesa 142, 342, 542, 642, 742, 842, 942), a base mesa on the collector mesa (e.g., the base mesa 144, 344, 544, 644, 744, 844, or 944), and an emitter mesa on the base mesa (e.g., the emitter mesa 146, 346, 546, 646, 746, 846, or 946). The base mesa has a tapered sidewall (e.g., the tapered sidewall 162, 362, 562, 662, 862, 962, or 1062), wherein the base mesa tapers from a wide bottom to a narrow top. The collector contacts have yet to be formed.

At 1104, a photoresist layer (e.g., the photoresist 930) is formed on the HBT. The photoresist is patterned with one or more openings (e.g., the openings 972) to expose a region of the collector mesa and a region of the tapered sidewall of the base mesa.

At 1106, a contact metal (e.g., the contact metal 912) is deposited through the openings on the exposed region of the collector mesa and the exposed region of the tapered sidewall of the base mesa, forming collector contacts of the HBT. The contact metal will be deposited over the photoresist layer as well. Those metal, including the photoresist layer, is removed through lift-off process.

Figure 12:
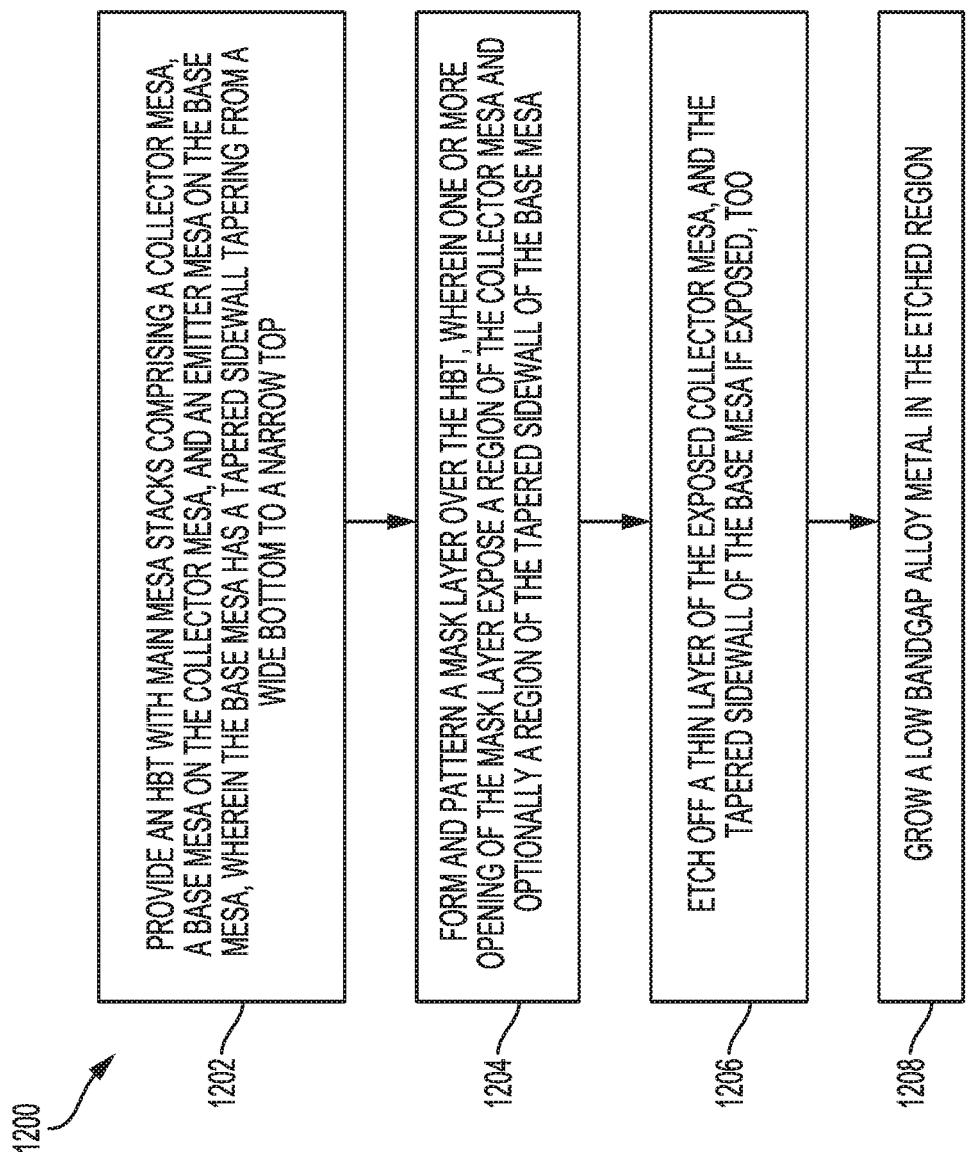
FIG. 12 illustrates an exemplary method for forming a collector ohmic contact layer according to certain aspects of the present disclosure.

FIG. 12 illustrates an exemplary method 1200 for forming a collector ohmic contact layer for an HBT according to certain aspects of the present disclosure. At 1202, an HBT is provided (e.g., the HBT 900). The HBT comprises main stacks with a collector mesa (e.g., the collector mesa 142, 342, 542, 642, 742, 842, or 942), a base mesa on the collector mesa (e.g., the base mesa 144, 344, 544, 644, 744, 844, or 944), and an emitter mesa on the base mesa (e.g., the emitter mesa 146, 346, 546, 646, 746, 846, or 946). The base mesa has a tapered sidewall (e.g., the tapered sidewall 162, 362, 562, 662, 862, 962, or 1062), wherein the base mesa tapers from a wide bottom to a narrow top.

At 1204, a mask layer (e.g., the mask 1030) is formed over the HBT. The mask layer may be silicon oxide or silicon nitride or the like. The mask layer is then patterned to exposes a region of the collector mesa and optionally a region of the tapered sidewall of the base mesa.

At 1206, a thin layer of the exposed collector mesa, and the tapered sidewall of the base mesa if exposed, is etched off.

At 1208, a low bandgap alloy metal (whose bandgap is lower than that of the sub-collector) is regrown in the etched region to form a collector ohmic contact layer. The low bandgap alloy metal may be InAs or InGaAs. The regrowth may be done by MBE or MOCVD at low temperature (e.g., less than 300° C.).

Collector contacts may be formed through the method 1100 after the regrowth of the low bandgap alloy metal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A heterojunction bipolar transistor (HBT), comprising:
 a collector mesa including a substrate and a first sub-collector;
 a base mesa on the collector mesa, wherein the base mesa includes a collector on the collector mesa and a base on the collector, and wherein the collector has a tapered sidewall tapering from a wide bottom to a narrow top;
 an emitter mesa on the base mesa; and
 a collector contact on a portion of the collector mesa and extending to a portion of the tapered sidewall of the base mesa the collector.

2. The heterojunction bipolar transistor (HBT) of claim 1, wherein the collector mesa comprises GaAs.

3. The heterojunction bipolar transistor (HBT) of claim 1, wherein the base mesa comprises a second sub-collector on the collector mesa.

4. The heterojunction bipolar transistor (HBT) of claim 3, wherein the first sub-collector and the second sub-collector comprise same material.

5. The heterojunction bipolar transistor (HBT) of claim 4, wherein the first sub-collector and the second sub-collector comprise GaAs.

6. The heterojunction bipolar transistor (HBT) of claim 3 further comprising an etch stop layer between the first sub-collector and the second sub-collector.

7. The heterojunction bipolar transistor (HBT) of claim 3, wherein the collector contact extends to a sidewall of the second sub-collector.

8. The heterojunction bipolar transistor (HBT) of claim 1, wherein the collector contact is on a lower portion of the tapered sidewall of the collector.

9. The heterojunction bipolar transistor (HBT) of claim 1 further comprising a metal alloy between the collector contact and the collector mesa.

10. The heterojunction bipolar transistor (HBT) of claim 9, wherein the metal alloy has a bandgap lower than that of the collector mesa.

11. The heterojunction bipolar transistor (HBT) of claim 9, wherein the metal alloy comprises InAs or InGaAs.

12. The heterojunction bipolar transistor (HBT) of claim 9, wherein the metal alloy is further between the collector contact and a portion of the sidewall of the base mesa.

13. The heterojunction bipolar transistor (HBT) of claim 9, wherein the metal alloy is formed at a temperature lower than 300° C.

\* \* \* \* \*